(12) United States Patent
Surthi et al.

(10) Patent No.: US 12,557,289 B2
(45) Date of Patent: Feb. 17, 2026

(54) ELECTRONIC DEVICES COMPRISING ADJOINING OXIDE MATERIALS AND RELATED SYSTEMS

(71) Applicant: Micron Technology, Inc., Boise, ID (US)

(72) Inventors: Shyam Surthi, Boise, ID (US); Richard J. Hill, Boise, ID (US); Gurtej S. Sandhu, Boise, ID (US); Byeung Chul Kim, Boise, ID (US); Francois H. Fabreguette, Boise, ID (US); Chris M. Carlson, Nampa, ID (US); Michael E. Koltonski, Boise, ID (US); Shane J. Trapp, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 362 days.

(21) Appl. No.: 18/324,068

(22) Filed: May 25, 2023

(65) Prior Publication Data

US 2024/0130124 A1   Apr. 18, 2024

Related U.S. Application Data

(62) Division of application No. 17/013,047, filed on Sep. 4, 2020, now Pat. No. 11,672,118.

(51) Int. Cl.
*H10B 43/27* (2023.01)
(52) U.S. Cl.
CPC ................... *H10B 43/27* (2023.02)

(58) Field of Classification Search
CPC ................... H10B 43/27; H10B 43/20
See application file for complete search history.

(56) References Cited

U.S. PATENT DOCUMENTS

| | | |
|---|---|---|
| 10,164,009 B1 | 12/2018 | Carlson |
| 10,388,667 B2 | 8/2019 | Carlson et al. |
| 10,446,572 B2 | 10/2019 | Carlson |
| 10,453,855 B2 | 10/2019 | Carlson et al. |
| 2012/0256247 A1 | 10/2012 | Alsmeier |
| 2015/0108562 A1 | 4/2015 | Chen et al. |
| 2015/0294980 A1 | 10/2015 | Lee et al. |
| 2017/0278859 A1 | 9/2017 | Sharangpani et al. |
| 2018/0294272 A1 | 10/2018 | Fan et al. |
| 2019/0051656 A1* | 2/2019 | Carlson ............... H10B 43/27 |

(Continued)

OTHER PUBLICATIONS

International Search Report for Application No. PCT/US2021/047653, mailed Dec. 16, 2021, 5 pages.

(Continued)

*Primary Examiner* — Christopher A Johnson
(74) *Attorney, Agent, or Firm* — TraskBritt

(57) ABSTRACT

An electronic device comprising a cell region comprising stacks of alternating dielectric materials and conductive materials. A pillar region is adjacent to the cell region and comprises storage node segments adjacent to adjoining oxide materials and adjacent to a tunnel region. The storage node segments are separated by a vertical portion of the tunnel region. A high-k dielectric material is adjacent to the conductive materials of the cell region and to the adjoining oxide materials of the pillar region. Additional electronic devices are disclosed, as are methods of forming an electronic device and related systems.

20 Claims, 12 Drawing Sheets

(56) References Cited

U.S. PATENT DOCUMENTS

2020/0075617 A1    3/2020  Saxler
2020/0168626 A1*   5/2020  Liu .................. H10B 43/35

OTHER PUBLICATIONS

Kim et al., Integrated Assemblies Having Charge-Trapping Material Arranged in Vertically-Spaced Segments, and Methods of Forming Integrated Assemblies, U.S. Appl. No. 16/374,527, filed Apr. 3, 2019.

Kim et al., Integrated Assemblies Having Vertically-Spaced Channel Material Segments, and Methods of Forming Integrated Assemblies, U.S. Appl. No. 16/548,267, filed Aug. 22, 2019.

Written Opinion of the International Searching Authority for Application No. PCT/US2021/047653, mailed Dec. 16, 2021, 5 pages.

* cited by examiner

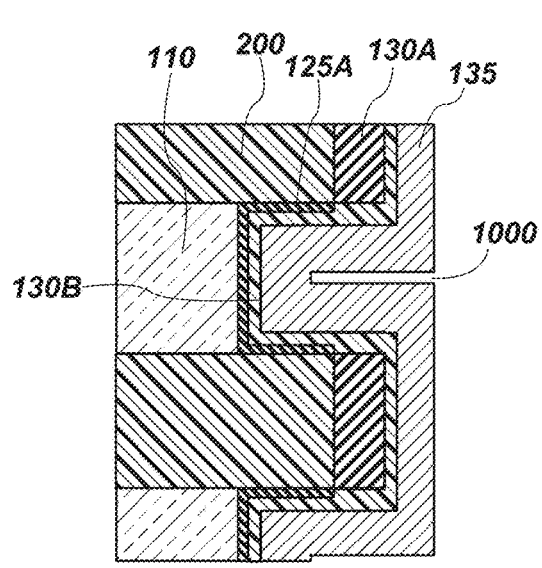
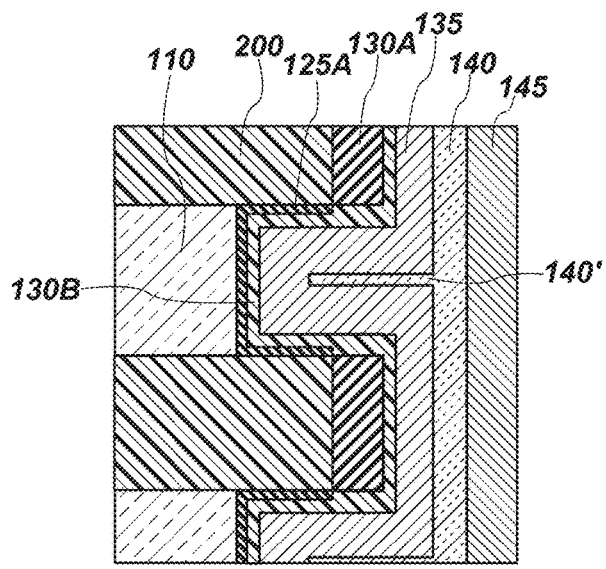
FIG. 10　　　　　FIG. 11
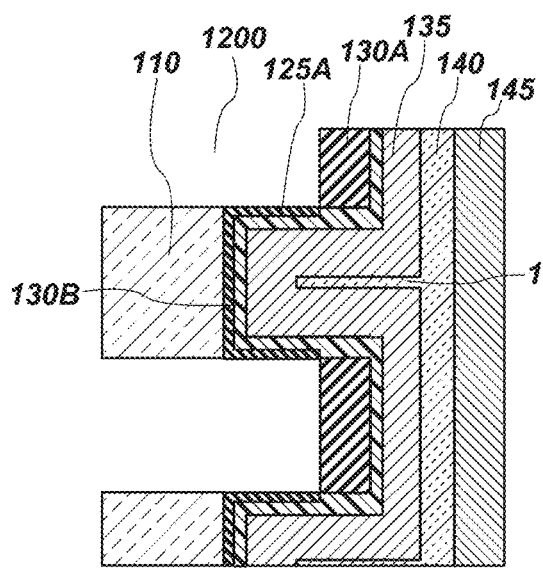
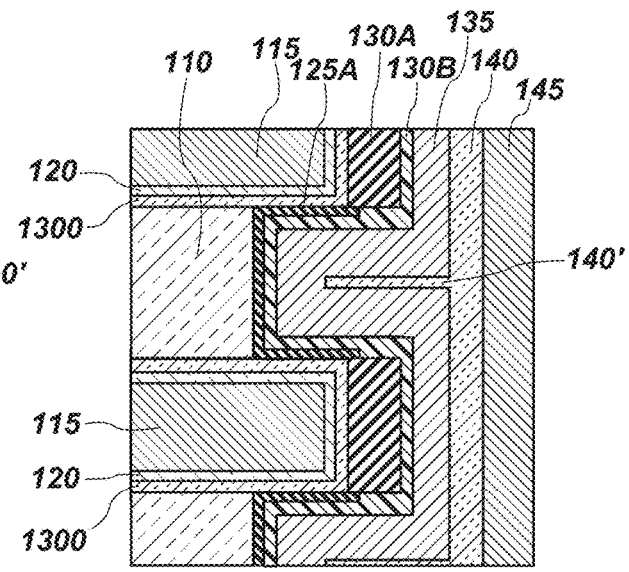
FIG. 12　　　　　FIG. 13

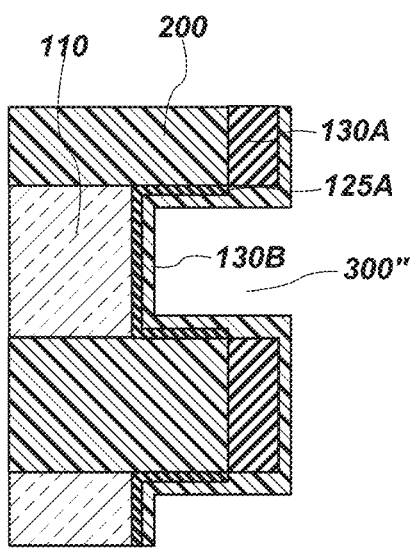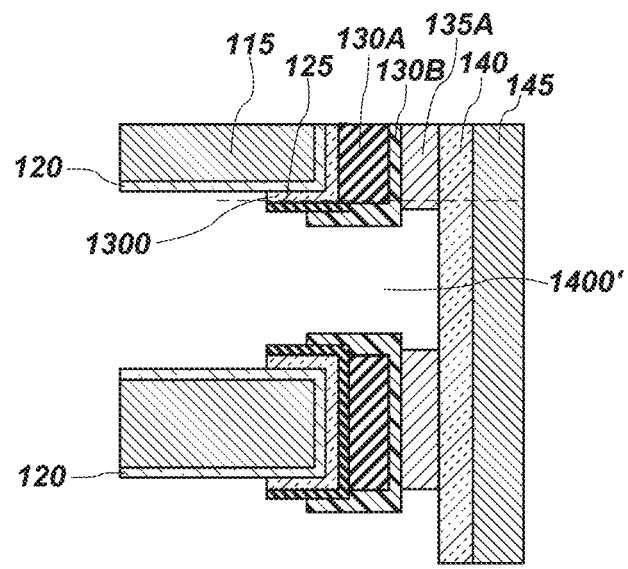
FIG. 25A
FIG. 25B
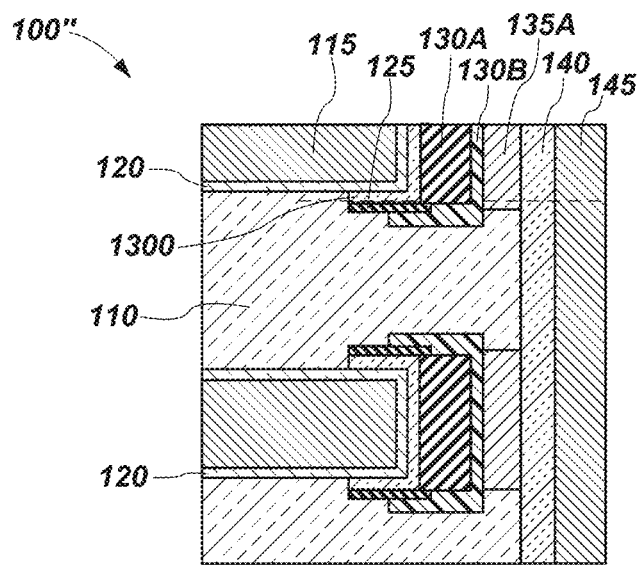
FIG. 25C

ELECTRONIC DEVICES COMPRISING ADJOINING OXIDE MATERIALS AND RELATED SYSTEMS

CROSS-REFERENCE TO RELATED APPLICATION

This application is a divisional of U.S. patent application Ser. No. 17/013,047, filed Sep. 4, 2020, now U.S. Pat. No. 11,672,118, issued Jun. 6, 2023, the disclosure of which is hereby incorporated herein in its entirety by this reference.

TECHNICAL FIELD

Embodiments disclosed herein relate to electronic devices and electronic device fabrication. More particularly, embodiments of the disclosure relate to electronic devices comprising adjoining oxide materials and to related methods and systems.

BACKGROUND

Electronic device (e.g., semiconductor device, memory device) designers often desire to increase the level of integration or density of features (e.g., components) within an electronic device by reducing the dimensions of the individual features and by reducing the separation distance between neighboring features. Electronic device designers also desire to design architectures that are not only compact, but offer performance advantages, as well as simplified designs. Reducing the dimensions and spacing of features has placed increasing demands on the methods used to form the electronic devices. One solution has been to form three-dimensional (3D) electronic devices, such as 3D NAND devices, in which memory cells are stacked vertically on a substrate. However, as the memory cells are formed closer together and at smaller dimensions, wordline-wordline resistance (RC) (a product of resistance and capacitance) increases. In addition, wordline-wordline coupling increases and program erase and data retention issues arise.

BRIEF DESCRIPTION OF THE DRAWINGS

FIGS. 2-18 are cross-sectional views that illustrate forming the electronic structure of FIG. 1 according to embodiments of the disclosure;

FIGS. 25A and 25B are cross-sectional views that illustrate forming the electronic structure of FIG. 25C according to yet other embodiments of the disclosure;

DETAILED DESCRIPTION

Figure 1:
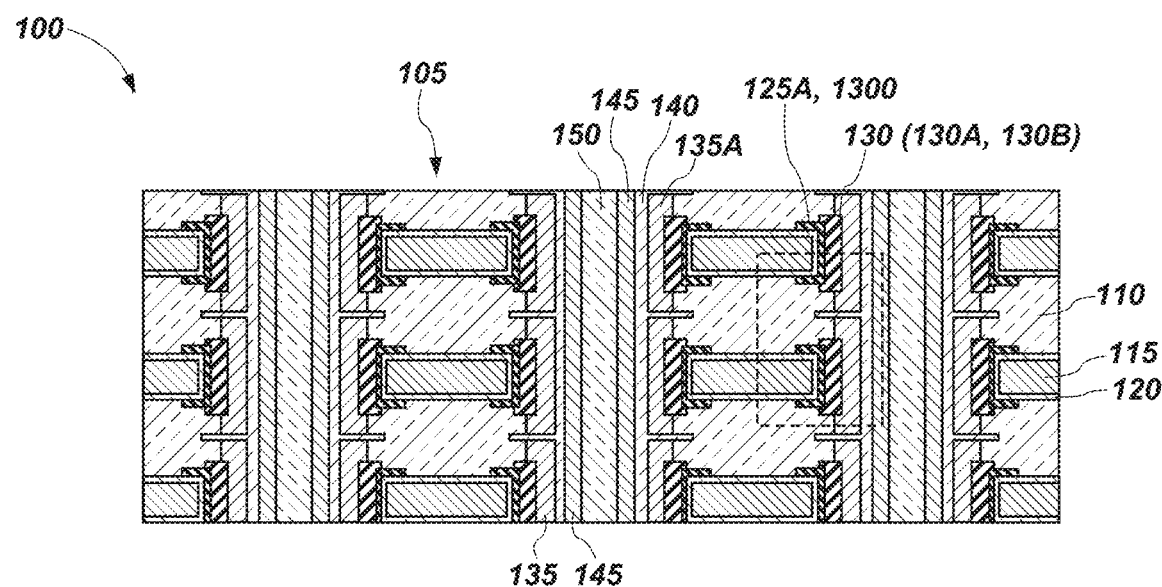
FIG. 1 is a cross-sectional view of an electronic structure including adjoining oxide materials according to embodiments of the disclosure.

An electronic device (e.g., an apparatus, a semiconductor device, a memory device) that includes multiple, adjoining oxide materials is disclosed. The adjoining oxide materials are present between storage node segments and high-k dielectric materials of the electronic device. The multiple (e.g., two or more), adjoining oxide materials are present in an electronic structure of the electronic device and are substantially coextensive with one another. Each of the oxide materials is formed by a different process. One of the oxide materials is formed by a selective process and another of the oxide materials is formed by a non-selective process. By using different processes, the oxide materials may be formed at different relative thicknesses, which enables separation between segments of a storage node to be controlled. By adjusting the relative thicknesses of the oxide materials, spacing between vertically adjacent storage node segments is tailorable and wider separation between storage node segments may be achieved. In addition to providing tailorability, the oxide materials may function as an etch stop during fabrication of the electronic structure. Including the adjoining oxide materials in the electronic device provides access to the storage nodes, enabling separation of the storage nodes into the storage node segments. The storage node segments are separated from channels of the electronic device by tunnel regions. The oxide materials also provide increased separation between conductive materials (e.g., wordlines) of the electronic structure and the storage node segments. The presence of the adjoining oxide materials does not negatively affect electrical performance properties, such as wordline-wordline resistance, wordline-wordline coupling, erase performance, data retention, etc., of the electronic device containing the electronic structure.

The following description provides specific details, such as material types, material thicknesses, and process conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete description of an electronic device or a complete process flow for manufacturing the electronic device and the structures described below do not form a complete electronic device. Only those process acts and structures necessary to understand the embodiments described herein are described in detail below. Additional acts to form a complete electronic device may be performed by conventional techniques.

Unless otherwise indicated, the materials described herein may be formed by conventional techniques including, but not limited to, spin coating, blanket coating, chemical vapor deposition (CVD), atomic layer deposition (ALD), plasma enhanced ALD, physical vapor deposition (PVD) (including sputtering, evaporation, ionized PVD, and/or plasma-enhanced CVD), or epitaxial growth. Alternatively, the materials may be grown in situ. Depending on the specific material to be formed, the technique for depositing or growing the material may be selected by a person of ordinary skill in the art. The removal of materials may be accomplished by any suitable technique including, but not limited to, etching (e.g., dry etching, wet etching, vapor etching), ion milling, abrasive planarization (e.g., chemical-mechanical planarization), or other known methods unless the context indicates otherwise.

Drawings presented herein are for illustrative purposes only, and are not meant to be actual views of any particular material, component, structure, electronic device, or electronic system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, the singular forms "a," "an," and "the" are intended to include the plural forms as well, unless the context clearly indicates otherwise.

As used herein, "and/or" includes any and all combinations of one or more of the associated listed items.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the term "configured" refers to a size, shape, material composition, and arrangement of one or more of at least one structure and at least one apparatus facilitating operation of one or more of the structure and the apparatus in a pre-determined way.

As used herein, the term "electronic device" includes, without limitation, a memory device, as well as semiconductor devices which may or may not incorporate memory, such as a logic device, a processor device, or a radiofrequency (RF) device. Further, an electronic device may incorporate memory in addition to other functions such as, for example, a so-called "system on a chip" (SoC) including a processor and memory, or an electronic device including logic and memory. The electronic device may, for example, be a 3D electronic device, such as a 3D NAND Flash memory device.

As used herein, the term "etch stop" material means and includes a material that is resistant to removal (e.g., etch) relative to removal of one or more other exposed materials.

As used herein, the term "high-k dielectric material" means and includes a dielectric oxide material having a dielectric constant greater than the dielectric constant of silicon oxide ($SiO_x$), such as silicon dioxide ($SiO_2$). The high-k dielectric material may include, but is not limited to, a high-k oxide material, a high-k metal oxide material, or a combination thereof. By way of example only, the high-k dielectric material may be aluminum oxide, gadolinium oxide, hafnium oxide, niobium oxide, tantalum oxide, titanium oxide, zirconium oxide, hafnium silicate, a combination thereof, or a combination of one or more of the listed high-k dielectric materials with silicon oxide.

As used herein, reference to an element as being "on" or "over" another element means and includes the element being directly on top of, adjacent to (e.g., laterally adjacent to, vertically adjacent to), underneath, or in direct contact with the other element. It also includes the element being indirectly on top of, adjacent to (e.g., laterally adjacent to, vertically adjacent to), underneath, or near the other element, with other elements present therebetween. In contrast, when an element is referred to as being "directly on" or "directly adjacent to" another element, no intervening elements are present.

As used herein, the term "selectively etchable" means and includes a material that exhibits a greater etch rate responsive to exposure to a given etch chemistry and/or process conditions relative to another material exposed to the same etch chemistry and/or process conditions. For example, the material may exhibit an etch rate that is at least about five times greater than the etch rate of another material, such as an etch rate of about ten times greater, about twenty times greater, or about forty times greater than the etch rate of the another material. Etch chemistries and etch conditions for selectively etching a desired material may be selected by a person of ordinary skill in the art.

As used herein, the term "stacks" means and includes a feature having one or more materials vertically adjacent to one another. The stacks may include alternating dielectric materials and conductive materials, such as alternating oxide materials and metal materials or alternating oxide materials and polysilicon materials. Depending on the stage of fabrication of the electronic structure containing the stacks, the stacks may alternatively include alternating dielectric materials and nitride materials, such as alternating oxide materials and silicon nitride materials.

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99.0% met, or even at least 99.9% met.

As used herein, the term "substrate" means and includes a material (e.g., a base material) or construction upon which additional materials are formed. The substrate may be a an electronic substrate, a semiconductor substrate, a base semiconductor layer on a supporting structure, an electrode, an electronic substrate having one or more materials, layers, structures, or regions formed thereon, or a semiconductor substrate having one or more materials, layers, structures, or regions formed thereon. The materials on the electronic substrate or semiconductor substrate may include, but are not limited to, semiconductive materials, insulating materials, conductive materials, etc. The substrate may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

As used herein, the terms "vertical," "longitudinal," "horizontal," and "lateral" are in reference to a major plane of a structure and are not necessarily defined by Earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure.

An electronic structure 100 according to embodiments of the disclosure and including the adjoining oxide materials is shown in FIG. 1. The electronic structure 100 contains stacks 105 of alternating dielectric materials 110 and conductive materials 115, cell liners 120, first high-k dielectric materials 125A, second high-k dielectric materials 1300, oxide materials 130 including multiple adjoining portions, storage node segments 135A, tunnel regions 140, channels 145, and insulative materials 150 (e.g., fill materials). The first high-k dielectric material 125A and the second high-k dielectric material 1300 (see FIG. 18) constitute two portions of the high-k dielectric material 125, with each of the portions being the same chemical composition or a different chemical composition. The first high-k dielectric material 125A is adjacent to the oxide materials 130A, 130B and the second high-k dielectric material 1300 surrounds conductive materials 115 of the stacks 105. The adjoining oxide materials 130A, 130B may exhibit the same chemical composition. However, each of the oxide material 130A and the oxide material 130B is formed by a different process at a different stage of the fabrication process, enabling a storage node 135 (see FIGS. 10 and 11) to be easily separated into the storage node segments 135A. A pillar region of the electronic structure 100 includes the oxide material 130 including multiple adjoining portions, the storage node segments 135A, the tunnel region 140, the channel 145, and the insulative material 150. A cell region of the electronic structure 100 includes the dielectric materials 110, the conductive materials 115, the cell liner 120, the first high-k dielectric material 125A, and the second high-k dielectric material 1300.

The dielectric materials 110 of the stacks 105 may be silicon oxide, silicon nitride, silicon oxynitride, or other dielectric material. In some embodiments, the dielectric materials 110 are silicon oxide. The conductive materials 115 may function as wordlines (e.g., gates) of the electronic device containing the electronic structure 100. The conductive materials 115 of the stacks 105 may be any conductive material including, but not limited to, n-doped polysilicon, p-doped polysilicon, undoped polysilicon, or a metal. Locations of the conductive materials 115 correspond to where the nitride materials 200 (see, for example, FIG. 2) of the stacks 105 are initially present during fabrication of the electronic structure 100. In some embodiments, the conductive material 115 is n-doped polysilicon. In other embodiments, the conductive material 115 is tungsten. The conductive material 115 is isolated (e.g., electrically isolated) from other conductive materials in the electronic device by the first high-k dielectric material 125A, the storage node segments 135A, and the dielectric materials 110. The cell liner 120 substantially surrounds a perimeter of the conductive material 115. The cell liner 120 may be formed of titanium nitride, tungsten, or other conductive material. The stacks 105 may include multiple tiers of the alternating dielectric materials 110 and the conductive materials 115, such as greater than or equal to 50 tiers, greater than or equal to 100 tiers, greater than or equal to 200 tiers, or greater than or equal to 500 tiers. While FIG. 1 includes 3 tiers of the alternating dielectric materials 110 and the conductive materials 115, more tiers may be present. The tiers of the stacks 105 may be formed at a pitch of from about 30 nm to about 50 nm, such as from about 35 nm to about 50 nm, from about 35 nm to about 45 nm, from about 35 nm to about 40 nm, from about 40 nm to about 50 nm, or from about 45 nm to about 50 nm. In some embodiments, the tiers are formed at a pitch of about 45 nm. In other embodiments, the tiers are formed at a pitch of about 40 nm.

The stacks 105 may be high aspect ratio (HAR) features having an aspect ratio (i.e., a ratio of width to depth) of greater than or equal to about 5:1, such as from about 5:1 to about 100:1, from about 5:1 to about 50:1, from about 10:1 to about 40:1, from about 10:1 to about 30:1, from about 10:1 to about 20:1, from about 20:1 to about 50:1, from about 20:1 to about 40:1, or from about 20:1 to about 30:1. The pillar openings 205 (see FIG. 2) may also exhibit a high aspect ratio. In addition to the stacks 105 being configured as lines (e.g., wordlines), other configurations may be contemplated.

The first high-k dielectric material 125A may be formed from a high-k dielectric material having a dielectric constant greater than the dielectric constant of silicon dioxide. The high-k dielectric material 125 may be formed from aluminum oxide, hafnium oxide, zirconium oxide, tantalum oxide, a combination thereof, or a combination of silicon oxide and one or more of the listed materials. In some embodiments, the first high-k dielectric material 125A is formed from hafnium-doped silicon dioxide, where the ratio of hafnium to silicon is controlled to achieve a desired etch selectivity of the first high-k dielectric material 125A. The high-k dielectric material 125 may be selected to exhibit high etch selectivity relative to the dielectric materials 110 of the tiers. The high-k dielectric material 125 may also be selected to exhibit high etch selectivity relative to the conductive materials 115 of the tiers. While the high-k dielectric material 125 is illustrated in FIG. 1 as being a single material, the high-k dielectric material 125 includes multiple (e.g., greater than or equal to two) portions (first high-k dielectric material 125A, second high-k dielectric material 1300) as shown in the enlarged views of FIGS. 13-18. A thickness of the high-k dielectric material 125 may be sufficient to form a substantially continuous material over (e.g., adjacent to) exposed materials of the electronic structure 100 to protect the materials during subsequent process acts. The thickness of the high-k dielectric material 125 may range between about 1 nm and about 20 nm, such as between about 2 nm and about 8 nm, between about 2 nm and about 6 nm, between about 2 nm and about 4 nm, or between about 4 nm and about 8 nm, or between about 4 nm and about 6 nm.

The tunnel region 140 may be configured as a barrier between the storage node segments 135A and the channel 145. The tunnel region 140 may be positioned between the storage node segments 135A and the channel 145, separating the storage node segments 135A and the channel 145. The tunnel region 140 may directly contact the storage node segments 135A and the channel 145 along a length of the tunnel region 140. The tunnel region 140 extends vertically and is coextensive with the channel 145 on a first surface and a second surface opposing the first surface is substantially coextensive with the storage node segments 135A. A vertical portion of the tunnel region 140' extends laterally and separates the storage node 135 into the storage node segments 135A. The tunnel region 140 may include one or more materials, such as oxide materials, nitride materials, or a combination thereof. While the tunnel region 140 is illustrated in FIG. 1 as being a single material, the tunnel region 140 may include multiple materials, such as a combination of silicon oxide materials and silicon nitride materials. The materials may, for example, include a charge blocking material, a storage node material, and a tunnel dielectric material. The charge blocking material may include, but is not limited to, silicon dioxide, aluminum oxide, hafnium oxide, zirconium oxide, or a combination thereof. The storage node may include, but is not limited to, silicon nitride, silicon oxynitride, or a combination thereof. The tunnel dielectric material may include, but is not limited to, silicon dioxide, aluminum oxide, hafnium oxide, zirconium oxide, or a combination thereof. By way of example only, the tunnel region 140 may be a so-called "oxide-nitride-oxide" (ONO) structure (e.g., an interlayer poly dielectric structure), which may be referred to in the art as a barrier engineered material.

The storage node segments 135A may function as a charge trap region during use and operation of the electronic device containing the storage node segments 135A. The storage node segments 135A may, for example, be formed of silicon nitride. The storage node segments 135A are separated from the channel 145 by the tunnel region 140. A first surface of the storage node segments 135A directly contacts the tunnel region 140. A second surface, opposing the first surface, of the storage node segments 135A is in direct contact with the oxide material 130B, the dielectric materials 110, and the vertical portion of the tunnel region 140'. The storage node segments 135A are separated in a vertical direction by the vertical portion of the tunnel region 140'.

The oxide material 130 (e.g., oxide material 130A, oxide material 130B) is positioned between the storage node segments 135A and the first and second high-k dielectric materials 125, 1300. The oxide material 130 is a barrier dielectric material (e.g., a blocking dielectric material) and is selected to exhibit a low etch rate relative to the etch rate of the first and second high-k dielectric materials 125A, 1300. While the oxide material 130 is illustrated in FIG. 1 as being a single material, the oxide material 130 includes the two adjoining portions, oxide material 130A and oxide material 130B, which are included in the enlarged views of FIGS. 8-18. By way of example only, the oxide material 130 may be a silicon oxide material (e.g., $SiO_x$, $SiO_2$). The oxide material 130A and the oxide material 130B may be formed of the same chemical composition, with each portion formed by a different process, such as by using different chemistries and different conditions to form each of the oxide material 130A and the oxide material 130B. The portions of the oxide material 130 (e.g., the oxide material 130A, the oxide material 130B) may be distinguishable from one another due to being formed by different processes. By forming the oxide material 130A and the oxide material 130B at different stages in the fabrication process, separation of the storage nodes 135 into the storage node segments 135A may be conducted by a flexible and tailorable process. The oxide material 130A is laterally adjacent to the conductive materials 115, the cell liner 120, and the second high-k dielectric material 1300, and the oxide material 130B is laterally adjacent to the oxide material 130A and the storage node segments 135A. A first surface (e.g., a vertical surface) of the oxide material 130 directly contacts the storage node segments 135A and a second surface (e.g., another vertical surface, opposing the first surface), directly contacts the first and second high-k dielectric materials 125A, 1300. A portion of the oxide material 130 also directly contacts the dielectric materials 110. The oxide material 130B surrounds the oxide material 130A, with a vertical surface in direct contact with the storage node segments 135A and another vertical surface in direct contact with the oxide material 130A. Horizontal surfaces of the oxide material 130B are in direct contact with the dielectric materials 110 and the storage node segments 135A. The oxide material 130A and the oxide material 130B may function as an etch stop during fabrication of the electronic structure 100.

The channel 145 is adjacent to (e.g., on) the tunnel region 140 and the insulative material 150 is adjacent to the channel 145. The material of the channel 145 may be doped polysilicon, undoped polysilicon, or other channel material. In some embodiments, the channel 145 is formed of polysilicon. The insulative material 150 may be a dielectric material including, but not limited to, silicon dioxide, phosphosilicate glass, borosilicate glass, borophosphosilicate glass, fluorosilicate glass, titanium dioxide, hafnium oxide, zirconium dioxide, tantalum oxide, magnesium oxide, aluminum oxide, or a combination thereof.

Figure 2:
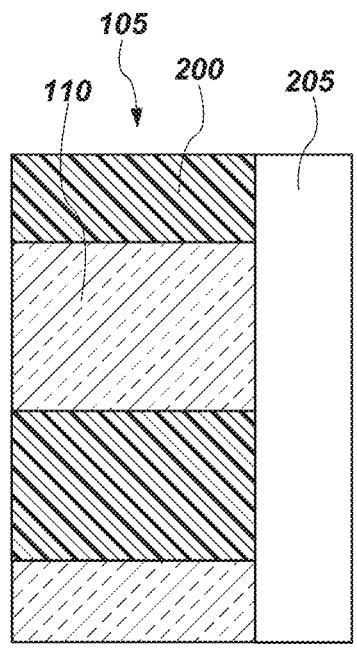

The electronic structure 100 of FIG. 1 may be formed as shown in FIGS. 2-18, which are cross-sectional views of portions of the electronic structure 100 during fabrication. The cross-sectional views in FIGS. 2-18 are enlarged views of the boxed region in FIG. 1. For simplicity, only a portion of the electronic structure 100 is illustrated in FIGS. 2-18, with the understanding that the remaining portion of the electronic structure 100 is a copy of the illustrated portion. To form the electronic structure 100, stacks 105 of alternating dielectric materials 110 and nitride materials 200 are formed by conventional techniques and pillar openings 205 are formed through the dielectric materials 110 and nitride materials 200, as shown in FIG. 2. The dielectric materials 110 may, for example, be silicon dioxide and the nitride materials 200 may, for example, be silicon nitride. Depending on the stage of fabrication, the electronic structure 100 contains the stacks 105 of alternating dielectric materials 110 and nitride materials 200 (see, for example, FIGS. 2-11) or the stacks 105 of alternating dielectric materials 110 and conductive materials 115 (see, for example, FIGS. 1, 13, and 18).

A portion of the dielectric materials 110 and nitride materials 200 is removed (e.g., etched) to form the stacks 105, with adjacent stacks 105 laterally separated from one another by the pillar openings 205. The pillar openings 205 are formed by conventional techniques, such as by etching the dielectric materials 110 and nitride materials 200 using conventional photolithography and etching techniques. A hardmask (not shown) may be used to form the pillar openings 205. The hardmask may be formed from a doped silicon nitride material, such as carbon-doped silicon nitride. The materials of the stacks 105 may, for example, be exposed to an anisotropic etch process, such as a dry plasma etch process or a reactive ion etch process, to form the stacks 105. Conventional etch chemistries and etch conditions may be used to form the stacks 105 and the pillar openings 205. The stacks 105 may be high aspect ratio (HAR) features having an aspect ratio (i.e., a ratio of width to depth) of greater than or equal to about 5:1, such as from about 5:1 to about 100:1, from about 5:1 to about 50:1, from about 10:1 to about 40:1, from about 10:1 to about 30:1, from about 10:1 to about 20:1, from about 20:1 to about 50:1, from about 20:1 to about 40:1, or from about 20:1 to about 30:1. The pillar openings 205 may also exhibit a high aspect ratio. In addition to the stacks 105 being configured as lines (e.g., wordlines), other configurations may be contemplated.

Figure 3:
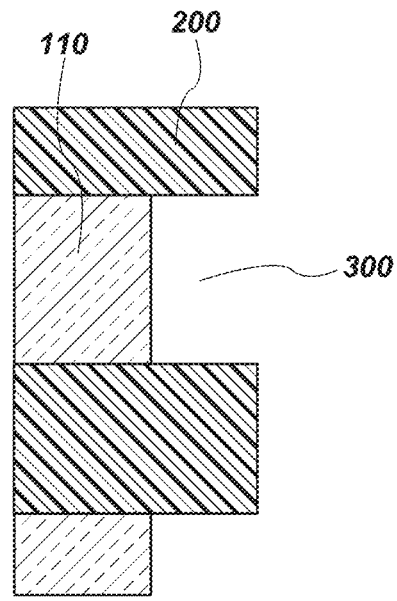
Figure 4:
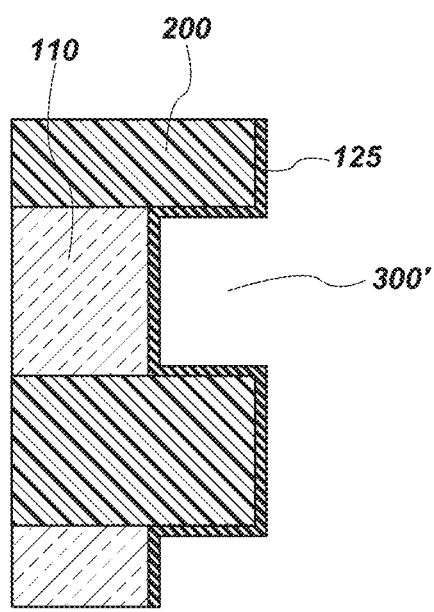

As shown in FIG. 3, a portion of the dielectric materials 110 is removed, forming recesses 300. The recesses 300 adjoin the pillar openings 205. The recesses 300 may form so-called "pockets" in which a portion of the oxide material 130 (e.g., a portion of the oxide material 130B), a portion of the storage node 135, and the tunnel region 140 are subsequently formed. The recesses 300 may be formed by conventional techniques, such as by using a selective etch process to remove the desired portion of the dielectric materials 110 without substantially removing material of the nitride materials 200. By way of example only, the dielectric materials 110 may be removed by a buffered oxide etch (BOE), a vapor etch, a hydrogen fluoride (HF) etch. Dimensions of the recesses 300 may depend on the pitch of the tiers and the etch conditions and etch chemistry used to form the recesses 300. By way of example only, the recesses 300 may exhibit dimensions of from about 5 nm to about 20 nm, such as from about 5 nm to about 15 nm or from about 10 nm to about 15 nm. The dimensions of the recesses 300 enable the oxide material 130 and the portion of the storage node 135 to be formed therein.

The first high-k dielectric material 125 is formed in the recesses 300, such as over exposed surfaces of the dielectric materials 110 and the nitride materials 200. The high-k dielectric material 125 may be conformally formed over sidewalls of the dielectric materials 110 and the nitride materials 200 and over horizontal surfaces of the nitride material 200. The high-k dielectric material 125 may be formed by conventional techniques. The thickness of the high-k dielectric material 125 may be sufficient to protect adjacent materials during subsequent process acts. For instance, the high-k dielectric material 125 may protect materials formed in the recesses 300 during subsequent removal of the nitride materials 200 and replacement by the conductive materials 115. Therefore, the high-k dielectric material 125 may function as a so-called "etch stop" during the subsequent process acts. Etch selectivity of the high-k dielectric material 125 relative to the nitride materials 200 may be tailored by adjusting a ratio of atoms, such as hafnium atoms to silicon atoms, during the formation of the high-k dielectric material 125.

Figure 5:
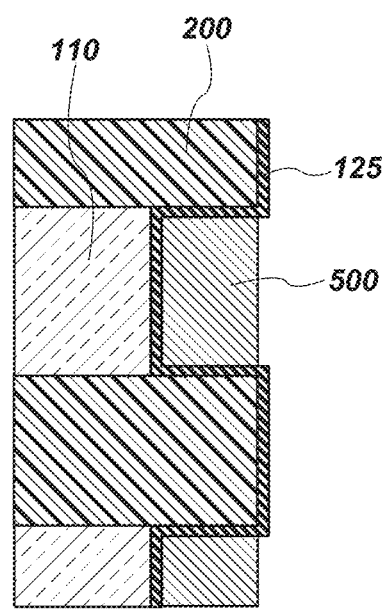

A sacrificial material 500 may be formed in remaining portions of the recesses 300', as shown in FIG. 5. The sacrificial material 500 may be formed in the recesses 300' and adjacent to the high-k dielectric material 125. The sacrificial material 500 may, for example, be formed from polysilicon. Excess sacrificial material 500 is removed, for example, by an etch process so that the high-k dielectric material 125 on the sidewalls of the nitride material 200 is exposed and a vertical surface of the sacrificial material 500 is substantially coplanar with the high-k dielectric material 125 on the sidewalls of the nitride material 200. The excess sacrificial material 500 may be removed by a wet etch process, such as an etch process using tetramethylammonium hydroxide (TMAH). Alternatively, the excess sacrificial material 500 may be removed in situ.

Figure 6:
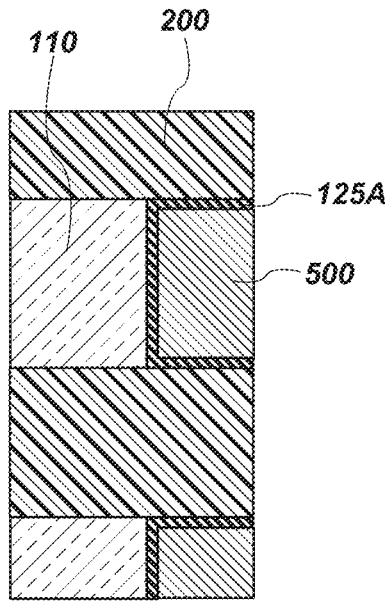

The high-k dielectric material 125 on the sidewalls of the nitride material 200 is removed, as shown in FIG. 6, exposing sidewalls of the nitride material 200 while portions of the first high-k dielectric material 125A remain in the recesses 300'. The high-k dielectric material 125 may be selectively removed without substantially removing portions of the first high-k dielectric material 125A between the sacrificial material 500 and the dielectric materials 110 and between the sacrificial material 500 and the nitride materials 200. By way of example only, the desired portions of the high-k dielectric material 125 may be removed by a wet etch process, such as by using DHF, BOE, or other wet etch chemistry. The first high-k dielectric material 125A may be annealed to alter its removal.

Figure 7:
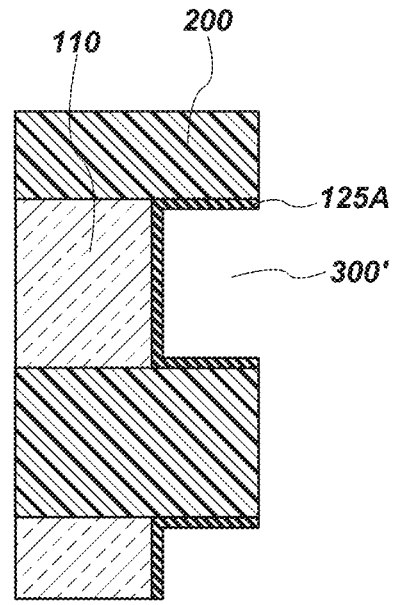

The sacrificial material 500 may be removed, as shown in FIG. 7, forming the recesses 300'. The sacrificial material 500 may be removed by conventional techniques, such as by a wet etch process. By way of example only, TMAH may be used to remove the sacrificial material 500. The first high-k dielectric material 125A remains in the recesses 300', such as on the sidewalls of the dielectric materials 110 and on horizontal surfaces of the nitride material 200 of the tiers.

Figure 8:
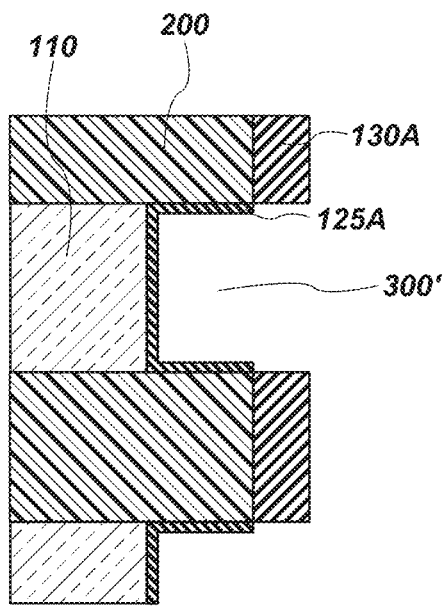

A first portion of the oxide material 130 (e.g., the oxide material 130A) is selectively formed on the sidewalls (e.g., exposed vertical surfaces) of the nitride materials 200 and in the recesses 300', as shown in FIG. 8. The oxide material 130A may be formed to a desired thickness. The oxide material 130A may exhibit a thickness of between about 1 nm and about 8 nm, such as between about 2 nm and about 5 nm, between about 3 nm and about 5 nm, between about 3 nm and about 4 nm, or between about 4 nm and about 5 nm. In some embodiments, the oxide material 130A exhibits a thickness of about 4 nm. In other embodiments, the oxide material 130A exhibits a thickness of about 5 nm. The oxide material 130A may, optionally, be subjected to a treatment act, such as to an anneal, before forming the oxide material 130B.

The oxide material 130A may be selectively grown adjacent to (e.g., laterally adjacent to) the nitride materials 200 of the tiers by forming a nitride material (not shown) on the sidewalls of the nitride material 200 and subsequently oxidizing the nitride material to form the oxide material 130A. Forming the nitride material and subsequently oxidizing the nitride material may be conducted in a single tool without breaking vacuum conditions in the tool. The oxide material 130A may be formed to a desired thickness by appropriately selecting an amount of the nitride material initially formed on the nitride materials 200 of the tiers. Alternatively, the oxide material 130A may be formed adjacent to (e.g., laterally adjacent to) the nitride materials 200 by, for example, incorporating a poisoning material in the first high-k dielectric material 125A and then forming the oxide material 130A on the sidewalls of the nitride materials 200 to the desired thickness. The poisoning material may prevent the oxide material 130A from being formed adjacent to (e.g., laterally adjacent to) the first high-k dielectric material 125A and the dielectric materials 110. The poisoning material may include, but is not limited to, N,N dimethylaminotrimethylsilane, bis(N,N-dimethylamino)dimethylsilane, ethylenediamine, 1-trimethylsilylpyrrolidine, 1-trimethylsilylpyrrole, 3,5-dimethyl-1-trimethylsilyl, and R1-(COH)—R2, where R1 and R2 are organic moieties. The thickness of the oxide material 130A corresponds to a desired lateral spacing between the storage node segments 135A and the conductive materials 115. Additional techniques of forming the oxide material 130A may be used.

Figure 9:
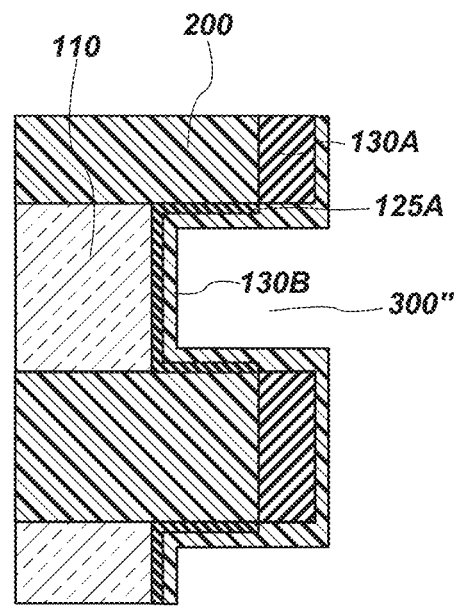

A second portion of the oxide material 130 (e.g., the oxide material 130B) is formed in the recesses 300' and adjacent to the first high-k dielectric material 125A and oxide material 130A, as shown in FIG. 9. The oxide material 130B is conformally formed on the first high-k dielectric material 125A and on the oxide material 130A by conventional techniques. Different chemistries and different conditions may be used to form the oxide material 130B compared to those used to form the oxide material 130A. The oxide material 130B may, optionally, be subjected to a treatment act, such as an anneal. Since a gap is present adjacent to the first high-k dielectric material 125A and the oxide material 130A, a portion of the oxide material 130B is also formed in the gap. Therefore, although the oxide material 130B is formed conformally, the oxide material 130B proximal to the gap may exhibit a greater thickness than the thickness of other portions of the oxide material 130B.

The oxide material 130B is formed to a desired thickness and the oxide material 130B exhibits a substantially uniform thickness except around the gap. The oxide material 130B may exhibit a thickness of between about 1 nm and about 8 nm, such as between about 1 nm and about 6 nm, between about 1 nm and about 4 nm, or between about 2 nm and about 6 nm. In some embodiments, the oxide material 130B exhibits a thickness of about 4 nm. The thickness of the oxide material 130B corresponds to a width of recessed openings 1600 (see FIG. 16) while the thickness of the oxide material 130A provide lateral spacing between the storage node segments 135A and the conductive materials 115. The thickness of the oxide material 130B in the recesses 300' may affect an amount of the storage node 135 and tunnel region 140 subsequently formed in the recesses 300'. A combined thickness of the adjoining oxide materials 130A, 130B, therefore, affects the spacing between the storage node segments 135A and the conductive materials 115 of the tiers and enables separation of the storage node 135 into the storage node segments 135A through the recessed openings 1600. The combined thickness of the oxide materials 130A, 130B may be between about 4 nm and about 12 nm, such as between about 4 nm and about 9 nm, between about 4 nm and about 6 nm, between about 4 nm and about 7 nm, or between about 6 nm and about 9 nm. In some embodiments, the combined thickness of the oxide materials 130A, 130B is about 9 nm.

The storage node 135, the tunnel region 140, and the channel 145 are sequentially formed adjacent to the oxide material 130B, such as laterally adjacent to the oxide material 130B, as shown in FIGS. 10 and 11. As shown in FIG. 10, the storage node 135 is conformally formed in the recesses 300'. The storage node 135 is formed as a continuous material and is subsequently separated into the storage node segments 135A. The storage node 135 may be formed at a thickness of between about 3 nm and about 12 nm, such as between about 5 nm and about 12 nm, between about 5 nm and about 10 nm, between about 5 nm and about 9 nm, between about 7 nm and about 12 nm, or between about 6 nm and about 12 nm. In some embodiments, the storage node 135 is formed at a thickness of about 8 nm. The storage node 135 partially fills the recesses 300' with vertical openings 1000 remaining in the recesses 300'. Depending on a pitch of the tiers (i.e., the thicknesses of the dielectric materials 110 and the nitride materials 200), the storage node 135 may form a so-called "pinched off" region in the recesses 300' that corresponds to the vertical openings 1000. The storage node 135 may be formed by conventional techniques, such as by CVD or by ALD.

As shown in FIG. 11, the tunnel region 140 is formed adjacent to (e.g., laterally adjacent to) the storage node 135, with a portion of a material of the tunnel region 140 extending into the vertical openings 1000 and substantially filling the vertical openings 1000. The portion of the tunnel region 140 extending into the vertical openings 1000 forms vertical portion of the tunnel region 140', which separates the material of the storage node 135 into storage node segments 135A during a subsequent process act. The tunnel region 140 may be formed by conventional techniques, such as by CVD or by ALD.

A material of the channel 145 is formed adjacent to (e.g., laterally adjacent to) the tunnel region 140, such as on sidewalls of the tunnel region 140. The channel 145 may be formed by conventional techniques, such as by CVD or by ALD. While not shown in FIGS. 10-18, the insulative material 150 is formed between opposing portions of the material of the channel 145 by conventional techniques. The insulative material 150 is between adjacent portions of the channel 145, the tunnel region 140, and the storage node segments 135A of the pillar region.

As shown in FIG. 12, the nitride materials 200 are removed (e.g., exhumed, etched), exposing the oxide material 130A, the first high-k dielectric material 125A, and the dielectric materials 110 and forming cell openings 1200 between vertically adjacent dielectric materials 110 of the stacks 105. The nitride materials 200 may be removed by conventional techniques, such as by a wet etch process. Conventional etch chemistries and etch conditions may be used to remove the nitride materials 200, with the etch chemistry and etch conditions selected depending on the materials used for the nitride materials 200 and the oxide material 130A, the first high-k dielectric material 125A, and the dielectric materials 110. The etch chemistry and etch conditions may selectively remove the nitride materials 200 without substantially removing the oxide material 130A, the first high-k dielectric material 125A, and the dielectric materials 110.

A second high-k dielectric material 1300 is formed in the cell openings 1200, adjacent to the oxide material 130A, the first high-k dielectric material 125A, and the dielectric materials 110, as shown in FIG. 13. The second high-k dielectric material 1300 is conformally formed on horizontal surfaces of the dielectric materials 110 and of the first high-k dielectric material 125A and on vertical surfaces of the oxide material 130 (e.g., the oxide material 130A). The second high-k dielectric material 1300 directly contacts the oxide material 130A, the first high-k dielectric material 125A, and the dielectric materials 110. The second high-k dielectric material 1300 is conformally formed by conventional techniques to a desired thickness. In locations where the second high-k dielectric material 1300 and horizontal portions of the first high-k dielectric material 125A overlap (e.g., are adjoining), a combined thickness of the second high-k dielectric material 1300 and the first high-k dielectric material 125A protects materials in the pillar regions. The material of the second high-k dielectric material 1300 may be selected to be substantially resistant to etch conditions used during subsequent removal of the dielectric materials 110. The second high-k dielectric material 1300 and the first high-k dielectric material 125A may be formed of the same material or of different materials. In some embodiments, the second high-k dielectric material 1300 and the first high-k dielectric material 125A are formed of hafnium silicate. While FIG. 1 illustrates high-k dielectric material 125 as a single material for convenience, the enlarged views in FIGS. 13-18 show the second high-k dielectric material 1300 and the first high-k dielectric material 125A.

The cell liner 120 is conformally formed on the second high-k dielectric material 1300 and the conductive materials 115 are formed in the remaining volume of the cell openings 1200. The cell liner 120 and the conductive materials 115 are formed by conventional techniques. The cell liner 120 surrounds the conductive materials 115 and directly contacts the second high-k dielectric material 1300 and the conductive materials 115. The formation of the second high-k dielectric material 1300, the cell liner 120, and the conductive materials 115 in the cell openings 1200 may be conducted by a so-called "replacement gate" process.

Figure 14:
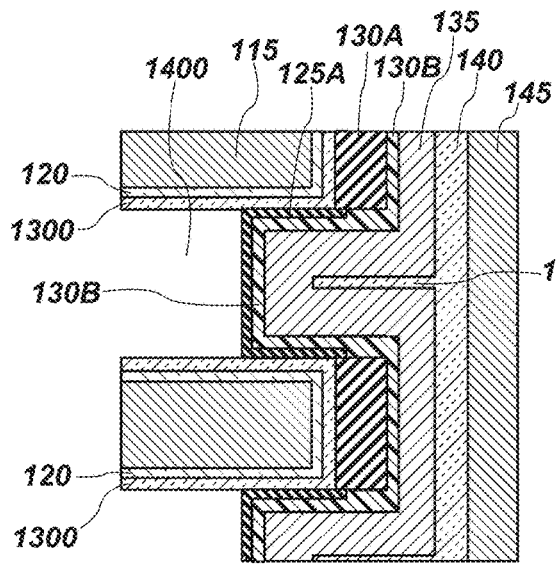

The dielectric materials 110 are removed, as shown in FIG. 14, forming openings 1400 between vertically adjacent conductive materials 115. The openings 1400 are defined by horizontal surfaces of the second high-k dielectric material 1300 and vertical surfaces of the first high-k dielectric material 125A. The dielectric materials 110 are selectively removed relative to the second high-k dielectric material 1300, the first high-k dielectric material 125A, and the conductive materials 115. The dimensions of the openings 1400 may substantially correspond to desired dimensions of the dielectric materials 110 in the electronic structure 100 (see FIG. 1). The selective removal of the dielectric materials 110 at this process stage enables subsequent removal of desired portions of the first high-k dielectric material 125A and the oxide material 130B, which ultimately affects the configuration of the storage node segments 135A as described below. The second high-k dielectric material 1300 and the first high-k dielectric material 125A may function as so-called "etch stop" materials to substantially prevent the removal of the oxide materials 130A, 130B as the dielectric materials 110 are removed. The selective removal of the dielectric materials 110 may be conducted by conventional techniques, such as by using conventional etch chemistries and etch conditions. By way of example only, the dielectric materials 110 may be selectively removed using a buffered oxide etch (BOE) by a spin process or a vapor etch process.

Figure 15:
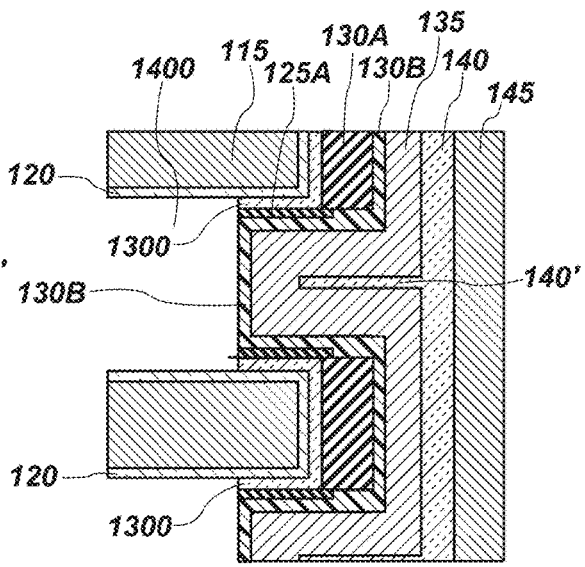

An exposed portion of the first high-k dielectric material 125A is removed, as shown in FIG. 15, exposing the oxide material 130B oriented in the vertical direction. The first high-k dielectric material 125A is selectively removed relative to the conductive materials 115, the second high-k dielectric material 1300, and the oxide materials 130A, 130B. A degree of etch selectivity between the first high-k dielectric material 125A and the conductive materials 115 may be high, such as exhibiting an etch selectivity of greater than or equal to about 20:1. A degree of etch selectivity between the first high-k dielectric material 125A and the oxide materials 130A, 130B may be lower, such as less than or equal to about 10:1. The first high-k dielectric material 125A is removed such that sidewalls of a remaining portion of the first high-k dielectric material 125A are substantially coplanar with the oxide material 130B. The first high-k dielectric material 125A is removed by a highly controllable process, such as by an atomic layer etching (ALE) process. The remaining portion of the first high-k dielectric material 125A is oriented in a horizontal direction, between the second high-k dielectric material 1300 and the first high-k dielectric material 125A.

Exposed portions of the second high-k dielectric material 1300 are also removed from horizontal surfaces of the cell liner 120 by conventional techniques and without substantially removing portions of the second high-k dielectric material 1300 between the cell liner 120 and the first high-k dielectric material 125A. The second high-k dielectric material 1300 is removed by conventional techniques. The portion of the second high-k dielectric material 1300 and the first high-k dielectric material 125A may be removed using a single etch chemistry or using two or more etch chemistries depending on the materials selected for the second high-k dielectric material 1300 and the first high-k dielectric material 125A. The remaining portion of the second high-k dielectric material 1300 between the cell liner 120 and the first high-k dielectric material 125A may be substantially coplanar with an exposed vertical surface of the oxide material 130B, as shown in FIG. 15.

Figure 16:
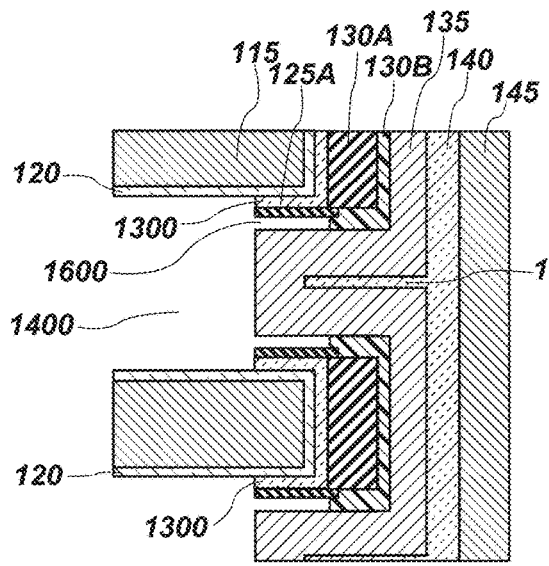

As shown in FIG. 16, a portion of the oxide material 130B is selectively removed relative to the conductive materials 115, the storage node 135, and the first and second high-k dielectric materials 125A, 1300, forming recessed openings 1600. The recessed openings 1600 are defined by horizontal surfaces of the storage node 135 and the first high-k dielectric material 125A and by vertical surfaces of the oxide material 130B. The recessed openings 1600 extend in the vertical direction and expose a portion of the oxide material 130B. The removal of the oxide material 130B exposes vertical surfaces of the storage node 135 and a portion of the horizontal surfaces of the storage node 135. The oxide material 130B may be removed so that the recessed openings 1600 extend in the vertical direction to a sufficient depth to enable removal of a portion of the storage node 135. The depth of the recessed openings 1600 overlaps with the vertical portion of the tunnel region 140'. A degree of etch selectivity between the oxide material 130B and the conductive materials 115 may be high, such as an etch selectivity of greater than or equal to about 20:1. A degree of etch selectivity between the oxide material 130B and the storage node 135 may be lower, such as less than or equal to about 10:1. The dimensions of the recessed openings 1600 may be sufficient to enable the removal of the portion of the oxide material 130B by conventional techniques. By way of example only, the oxide material 130B may be removed using a BOE, HF, or a vapor etch process to form the recessed openings 1600.

Figure 17:
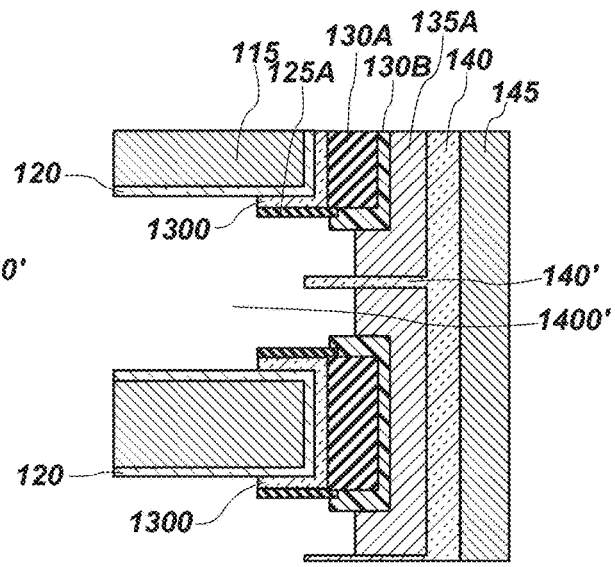

The storage node segments 135A may then be formed by removing a portion of the storage node 135, as shown in FIG. 17. The storage node 135 is removed in a lateral direction, extending the openings 1400 to openings 1400'. The desired portion of the storage node 135 is selectively removed relative to the vertical portion of the tunnel region 140', separating the storage node 135 into the storage node segments 135A. The desired portion of the storage node 135 is also selectively removed relative to the oxide material 130B, the first high-k dielectric material 125A, and the second high-k dielectric material 1300. A sufficient amount of the storage node 135 is removed to separate the storage node 135 into the storage node segments 135A. By way of example only, the storage node 135 is removed until the vertical portion of the tunnel region 140' is exposed. While FIG. 17 shows about one-third of the vertical portion of the tunnel region 140' as being exposed, more or less of the vertical portion of the tunnel region 140' may be exposed. The remaining portion of the storage node 135 (i.e., the storage node segments 135A) may extend in the vertical direction to a length that is greater than a length of the oxide material 130B and the oxide material 130A. The storage node segments 135A may also extend around a portion of the oxide material 130B. The oxide material 130A may be in direct contact with the oxide material 130B and the second high-k dielectric material 130O, and the oxide material 130B may be in direct contact with the first high-k dielectric material 125A, the oxide material 130A, and the storage node segments 135A. The storage node 135 may be removed by conventional techniques, such as using an HF etch or a vapor etch process. While not shown in FIG. 17, portions of the tunnel region 140 may, optionally, be recessed or removed, forming the tunnel region 140 into segments.

Figure 18:
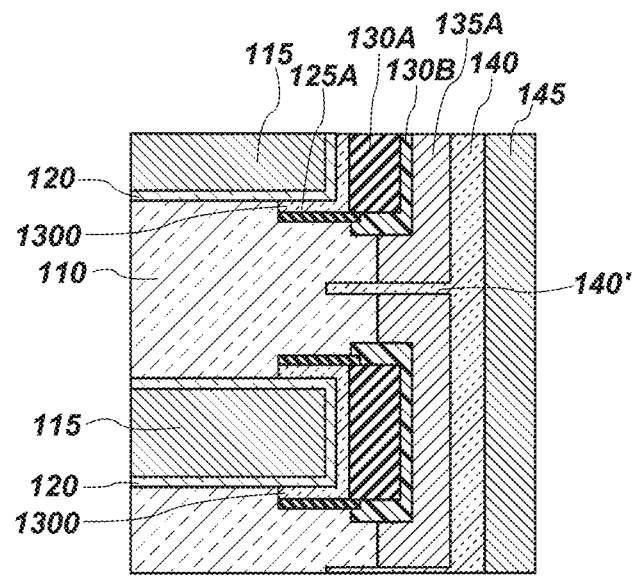

As shown in FIG. 18, the dielectric materials 110 may be formed in the openings 1400'. The chemical composition of the dielectric materials 110 may be the same as or different from the chemical composition of the dielectric materials 110 in FIG. 2. FIG. 18 is an enlarged view of the boxed region of the electronic structure 100 of FIG. 1, showing additional detail for the storage node segments 135A and the oxide materials 130A, 130B. The dielectric materials 110 may substantially fill the openings 1400'. In FIG. 18, the first high-k dielectric material 125A and the second high-k dielectric material 130O are shown separately, while in FIG. 1, the materials are indicated collectively as high-k dielectric material 125. Alternatively, the openings 1400' may remain substantially unfilled (e.g., an unfilled volume, a vacuum), such as voids that are empty of a solid material and/or liquid material. The voids are not necessarily empty of a gaseous material (e.g., air, oxygen, nitrogen, argon, helium, or a combination thereof) and may contain the gaseous material. For example, the voids may be "air gaps." The air gaps may, for example, be present between vertically adjacent conductive materials 115.

Figure 19:
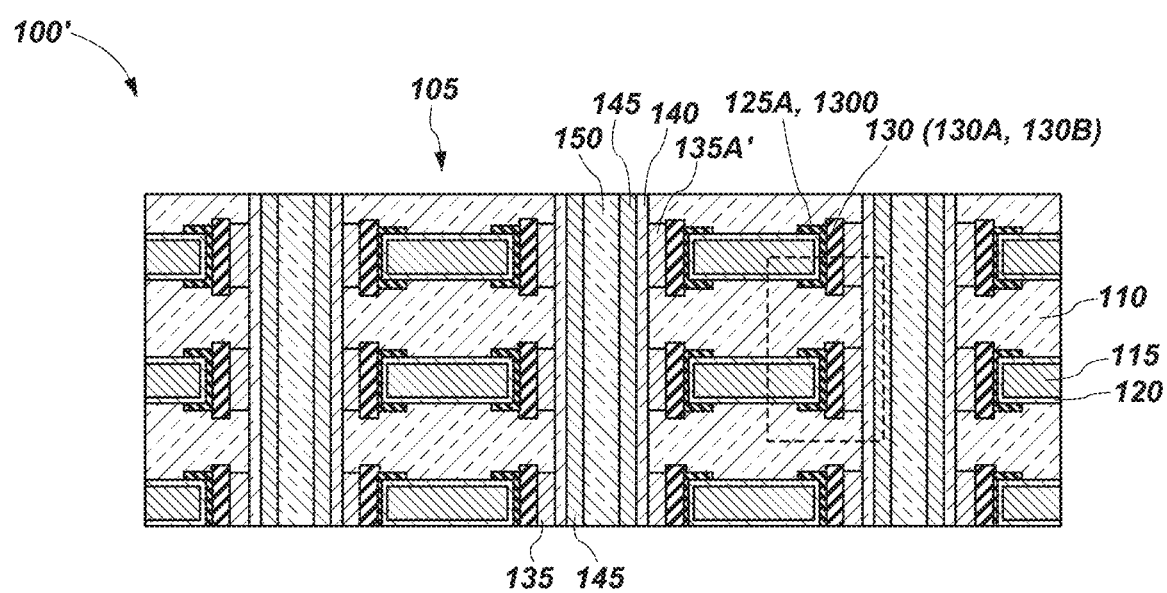
FIG. 19 is a cross-sectional view of an electronic structure including adjoining oxide materials according to other embodiments of the disclosure.

An electronic structure 100' according to other embodiments of the disclosure and including the adjoining oxide materials 130A, 130B is shown in FIG. 19. The material types, material thicknesses, etc., of the electronic structure 100' are as described above for FIG. 1. The electronic structure 100' differs from the electronic structure 100 primarily in the configuration of the storage node segments 135A' and the oxide materials 130A, 130B. The storage node segments 135A' have a length in the vertical direction that is less than the length of the oxide material 130. The storage node segments 135A' also do not surround the oxide material 130. The storage node segments 135A' directly contact the tunnel region 140, the oxide material 130, and the dielectric materials 110 (or the air gaps if present). The electronic structure 100' also lacks a vertically-oriented portion of the tunnel region 140, with the storage node segments 135A' separated from one another in the vertical direction by the dielectric materials 110. The configuration of the storage node segments 135A' and the oxide materials 130A, 130B may be desirable for electronic devices having a lower pitch. For instance, the tiers of the electronic structure 100' may exhibit a lower pitch than a pitch of the tiers in the electronic structure 100 of FIG. 1. By way of example only, the tiers of the electronic structure 100' may exhibit a pitch of less than or equal to about 40 nm. In addition, the storage node segments 135A' are formed from the storage node 135 by removing portions of the storage node 135 during fabrication of the electronic structure 100'. In contrast, the storage node segments 135A of the electronic structure 100 in FIGS. 1-18 are separated into the storage node segments 135A by the vertical portions of the tunnel region 140'.

Figure 20:
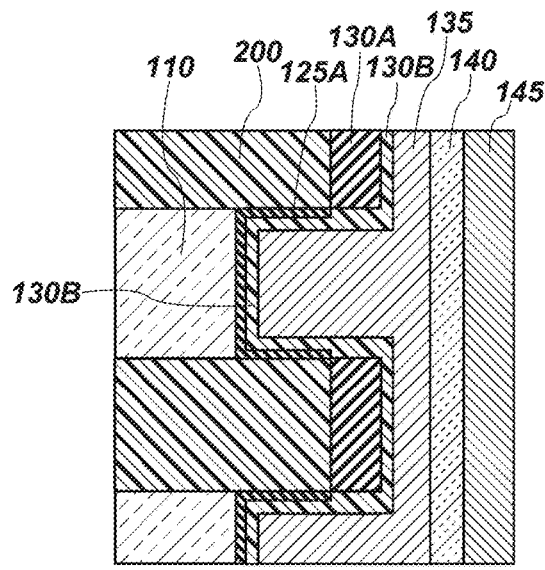
FIGS. 20-24 are cross-sectional views that illustrate forming the electronic structure of FIG. 19 according to other embodiments of the disclosure.
Figure 21:
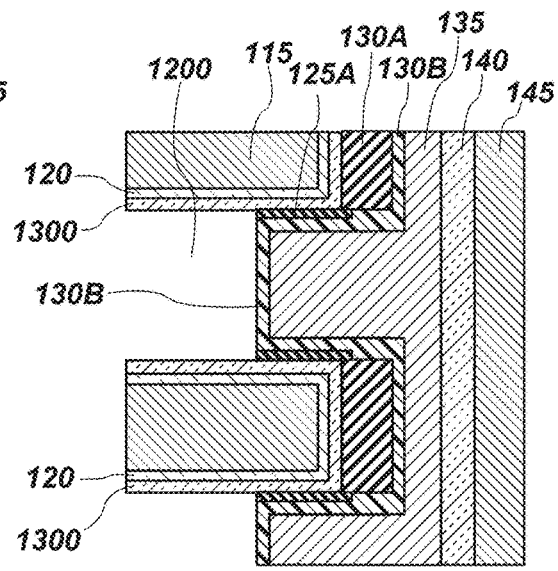

FIGS. 20-24 are cross-sectional views of portions of the electronic structure 100' during fabrication. The cross-sectional views in FIGS. 20-24 are enlarged views of the boxed region in FIG. 19. While the high-k dielectric material 125 is illustrated in FIG. 19 as being a single material, the high-k dielectric material 125 include the multiple (e.g., greater than or equal to two) portions (first high-k dielectric material 125A and second high-k dielectric material 130O) as shown in the enlarged views of FIGS. 21-24. While the oxide material 130 is illustrated in FIG. 19 as being a single material, the oxide material 130 includes the two portions, oxide material 130A and oxide material 130B, which are included in the enlarged views of FIGS. 20-24. For simplicity, only a portion of the electronic structure 100' is illustrated in FIGS. 20-24, with the understanding that the remaining portion of the electronic structure 100' is a copy of the illustrated portion. The process acts to form the electronic structure 100' may be conducted in a single tool. To form the electronic structure 100', dielectric materials 110, nitride materials 200, first high-k dielectric material 125A, oxide material 130A, and oxide material 130B are formed as described above in FIGS. 2-9. The storage node 135 is then formed in the recesses 300". The recesses 300 therefore include a portion of the oxide material 130 (e.g., a portion of the oxide material 130B) and a portion of the storage node 135. In contrast to the embodiments in FIGS. 1-18, the storage node 135 substantially completely fills the recesses 300", as shown in FIG. 20. Depending on the material used and the pitch of the tiers, a seam (not shown) may be present in the storage node 135. The tunnel region 140 and the channel 145 are formed adjacent to (e.g., laterally adjacent to) the storage node 135, as described above for FIG. 11. The nitride materials 200 are removed, forming cell openings 1200, as described above for FIG. 12. The second high-k dielectric material 130O, the cell liner 120, and the conductive materials 115 are formed in the cell openings 1200, as described above for FIG. 13. The dielectric materials 110 are removed by conventional techniques, as described above for FIG. 14, forming openings 1400, which are defined by horizontal surfaces of the second high-k dielectric material 130O and vertical surfaces of the first high-k dielectric material 125A. The dielectric materials 110 are selectively removed relative to the second high-k dielectric material 130O, the first high-k dielectric material 125A, and the conductive materials 115. The second high-k dielectric material 130O and the first high-k dielectric material 125A may function as so-called "etch stop" materials to substantially prevent the removal of the oxide materials 130A, 130B as the dielectric materials 110 are removed. The vertically-oriented portions of the first high-k dielectric material 125A are removed, as described above for FIG. 15, exposing the oxide material 130B in the cell openings 1200, as shown in FIG. 21. Portions of the second high-k dielectric material 130O are also removed, as described above for FIG. 15.

Figure 22:
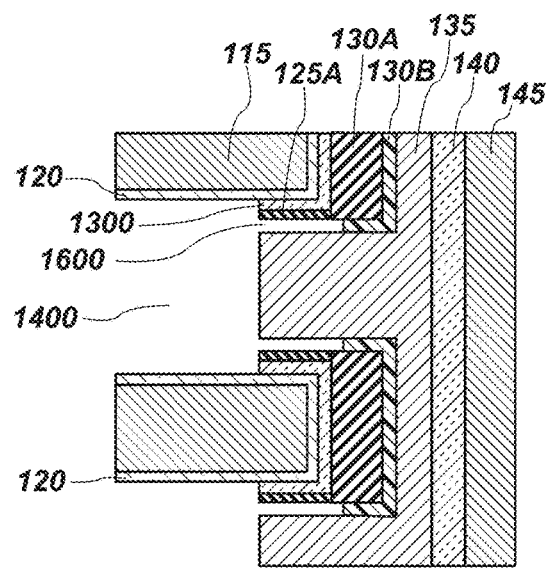
Figure 23:
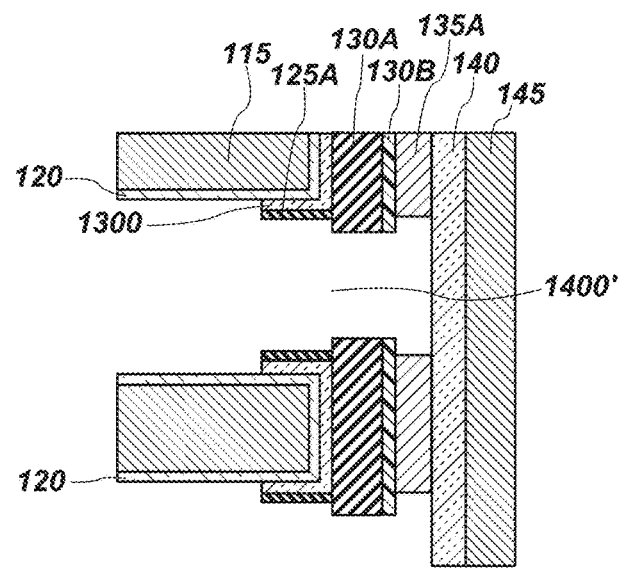

As shown in FIG. 22, the recessed openings 1600 are formed, by removing an exposed portion of the oxide material 130B, as described above for FIG. 16. A portion of the storage node 135 is subsequently removed through the recessed openings 1600, as shown in FIG. 23, forming storage node segments 135A. The storage node segments 135A are formed by removing the storage node 135 as described above for FIG. 17, except that the storage node 135 is removed in both the vertical direction and the horizontal direction, forming openings 1400'. As a result, the storage node segments 135A are spaced apart from one another in the vertical direction by the extended openings

1400'. To separate the storage node 135 into the storage node segments 135A, a highly controllable removal process (e.g., etch process) may be conducted to avoid etch rate changes along the seam, if present, of the storage node 135 in the recesses 300'. By way of example only, the removal process may be an ALE process, such as a vapor etch process. The etch process may remove portions of the oxide materials 130A, 130B and the storage node 135 in the lateral direction, such that the openings 1400' extend substantially through the storage node 135. The etch process may remove a sufficient portion of the storage node 135 in the vertical direction to ensure substantially complete separation of the storage node segments 135A. A length of the storage node segments 135A in the vertical direction may be less than a length of the oxide materials 130A, 130B in the vertical direction.

Figure 24:
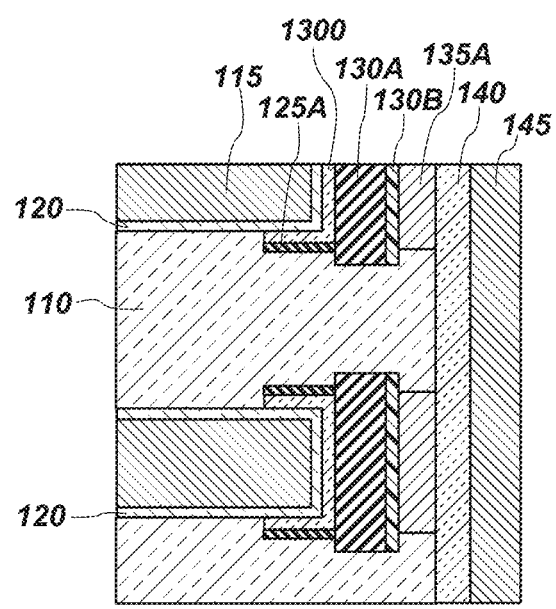

The dielectric materials 110 are subsequently formed in the openings 1400' to produce the electronic structure 100', as shown in FIG. 24. FIG. 24 is an enlarged view of the boxed region of the electronic structure 100' of FIG. 19, showing additional detail for the storage node segments 135A and the oxide materials 130A, 130B. The dielectric materials 110 are formed in the openings 1400' as described above for FIG. 18. Alternatively, the openings 1400' may remain substantially unfilled, forming air gaps between vertically adjacent conductive materials 115.

Since the storage node 135 is formed in the recesses 300" without creating a pinched off portion, the storage node 135 substantially fills the recesses 300". The storage node segments 135A are formed by removing desired portions of the storage node. Since no vertical opening is subsequently formed in the storage node 135, the channel 145 may exhibit a greater degree of uniform thickness compared to the channel 145 of the electronic structure 100. The flatter channel 145 may provide an improved string current in comparison to the electronic structure 100 of FIG. 1.

In both the electronic structure 100 and the electronic structure 100', the degree of separation between the storage node segments 135A may be adjusted by tailoring the thicknesses of the oxide materials 130A, 130B relative to one another. For a given combined thickness of the oxide materials 130A, 130B, the thickness at which the oxide material 130B is formed provides tailorability to the separation between vertically adjacent storage node segments 135A. Therefore, the oxide material 130B functions as a spacer to tailor the distance between the storage node segments 135A. By increasing the thickness of the as-formed oxide material 130B, the distance between adjacent storage node segments 135A is decreased. Conversely, by decreasing the thickness of the oxide material 130B as formed, the separation between adjacent storage node segments 135A is increased.

Figure 26A:
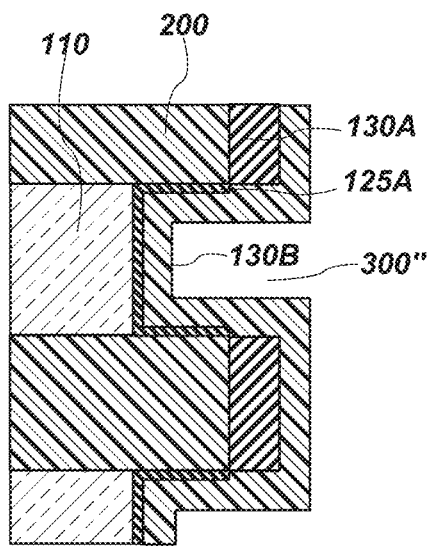
FIGS. 26A and 26B are cross-sectional views that illustrate forming the electronic structure of FIG. 26C according to still other embodiments of the disclosure.
Figure 26B:
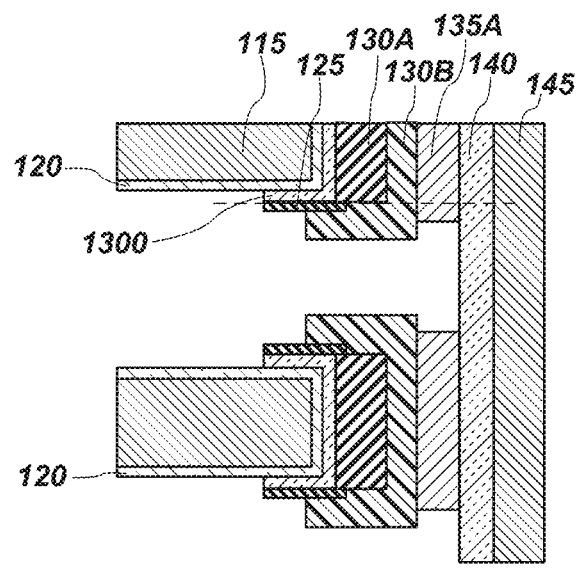
Figure 26C:
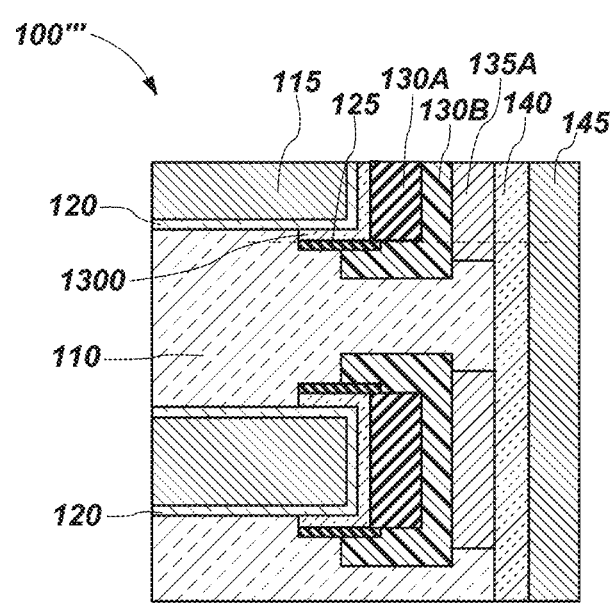

The effect of the oxide material 130B thickness on the distance between vertically adjacent storage node segments 135A of electronic structures 100' for a particular pitch is shown in FIGS. 25A-26C. A relatively smaller thickness for the oxide material 130B is shown in FIGS. 25A-25C, while a relatively larger thickness for the oxide material 130B is shown in FIGS. 26A-26C. In FIG. 25A, the dielectric materials 110, the nitride materials 200, the oxide material 130A, the oxide material 130B, the first high-k dielectric material 125A, and the recesses 300" are formed as described above for FIGS. 1 and 19. By way of example only, the pitch of the tiers of the dielectric materials 110 and the nitride materials 200 in FIGS. 25A-25C is about 40 nm, which corresponds to the pitch of the dielectric materials 110 and the conductive materials 115. The oxide material 130A may be formed on the nitride materials 200 at a thickness of about 7 nm and the oxide material 130B may be conformally formed over the oxide material 130A at a thickness of about 2 nm. Therefore, the combined thickness of the oxide materials 130A, 130B is about 9 nm. The storage node 135, tunnel region 140, and insulative material 150 are formed in the recesses 300" as described above for FIGS. 19 and 20. Portions of the first high-k dielectric material 125A and the oxide material 130B are removed as described above for FIGS. 21 and 22, exposing the storage node 135. As shown in FIG. 25B, portions of the storage node 135 are removed to form the storage node segments 135A as described above for FIG. 23. The dielectric materials 110 are subsequently formed in the openings 1400', as described above for FIG. 24, to form the electronic structure 100", as shown in FIG. 25C. Alternatively, the openings 1400' may remain substantially unfilled, forming air gaps between vertically adjacent conductive materials 115.

The relatively larger thickness for the oxide material 130B is shown in FIGS. 26A-26C. In FIG. 26A, the dielectric materials 110, the nitride materials 200, the oxide material 130A, the oxide material 130B, the first high-k dielectric material 125A, and the recesses 300" are formed as described above for FIGS. 1 and 19. The pitch of the tiers of the dielectric materials 110 and the nitride materials 200 are substantially the same as the pitch in FIG. 25A. Dimensions of the recesses 300" are also substantially the same as the dimensions of the recesses 300" in FIG. 25A. The oxide material 130A may be formed on the nitride materials 200 at a thickness of about 4 nm and the oxide material 130B may be conformally formed over the oxide material 130A at a thickness of about 5 nm. Therefore, the combined thickness of the oxide materials 130A, 130B is about 9 nm, the same as the combined thickness in the electronic structure 100" of FIG. 25C. The storage node 135, tunnel region 140, and insulative material 150 are formed in the recesses 300" as described above for FIGS. 19 and 20. Portions of the first high-k dielectric material 125A and the oxide material 130B are removed as described above for FIGS. 21 and 22, exposing the storage node 135. As shown in FIG. 26B, portions of the storage node 135 are removed to form the storage node segments 135A as described above for FIG. 23. The dielectric materials 110 are subsequently formed in the openings 1400', as described above for FIG. 24, to form the electronic structure 100''', as shown in FIG. 26C. Alternatively, the openings 1400' may remain substantially unfilled, forming air gaps between vertically adjacent conductive materials 115.

In FIGS. 25B, 25C, 26B, and 26C, a dashed line indicates the level of the cell liner 120. Comparing FIGS. 25C and 26C, the amount of separation (e.g., distance) between vertically adjacent storage node segments 135A differs. The separation between the vertically adjacent storage node segments 135A is greater in FIG. 25C than in FIG. 26C, even though the pitch of the tiers, the dimensions of the recesses 300', and the combined thicknesses of the oxide materials 130A, 130B are the same. In other words, the vertically adjacent storage node segments 135A extend further past the dashed line in FIG. 26C than in FIG. 25C. With the thickness of the oxide material 130B in the recesses 300" of FIG. 26B being thicker than the thickness of the oxide material 130B in the recesses 300" of FIG. 25B, the vertically adjacent storage node segments 135A extend further past the dashed line in FIG. 26C and the vertically adjacent storage node segments 135A are more closely spaced than in FIG. 25C. By adjusting the thickness of the oxide material 130B relative to the thickness of the oxide material 130A, the lateral overetch margin may be adjustable in the methods according to embodiments of the disclosure.

While not illustrated, similar effects may be observed for the effect of the oxide material 130B thickness on the distance between vertically adjacent storage node segments 135A of electronic structures 100 for a given pitch of the tiers, the dimensions of the recesses 300', and the combined thicknesses of the oxide materials 130A, 130B.

By forming the oxide materials 130A, 130B at different stages in the fabrication process and by adjusting the relative thicknesses of the oxide materials 130A, 130B, increased flexibility may be achieved in the fabrication process for the electronic structures 100, 100', 100", 100'". Using the oxide materials 130A, 130B according to embodiments of the disclosure may also provide improved scaling to the formation of electronic devices containing the electronic structures 100, 100', 100", 100'" as the pitch of the tiers in electronic devices continues to decrease. Since one or more of the process acts described above are not affected by the pitch of the tiers, the electronic devices containing the electronic structures 100, 100', 100", 100'" may be easily formed as device sizes decrease. By way of example only, the act of removing the dielectric materials 110 following the replacement gate process does not change as the tier pitch decreases. In addition, the act of removing the portions of the first and second high-k dielectric materials 125A, 1300 does not change as the tier pitch decreases. Using the oxide materials 130A, 130B according to embodiments of the disclosure also enables different amounts of the storage node 135 to be formed in the recesses 300". By varying the relative thickness of the oxide materials 130A, 130B, the amount of space available in the recesses 300" for the storage node 135 may be adjusted. In addition, using the oxide materials 130A, 130B according to embodiments of the disclosure enables a more simple process to be used to form the storage node segments 135A from the storage nodes 135. A single act to remove the desired portions of the storage nodes 135 to form the storage node segments 135A may be conducted, reducing the complexity of separating the storage node segments 135A. These benefits are achieved without negatively affecting electrical performance properties of the electronic device containing the electronic structures 100, 100', 100", 100'".

Accordingly, an electronic device is disclosed. The electronic device comprises a cell region comprising stacks of alternating dielectric materials and conductive materials. A pillar region is adjacent to the cell region and comprises storage node segments adjacent to adjoining oxide materials and adjacent to a tunnel region. The storage node segments are separated by a vertical portion of the tunnel region. A high-k dielectric material is adjacent to the conductive materials of the cell region and to the adjoining oxide materials of the pillar region.

Figure 27:
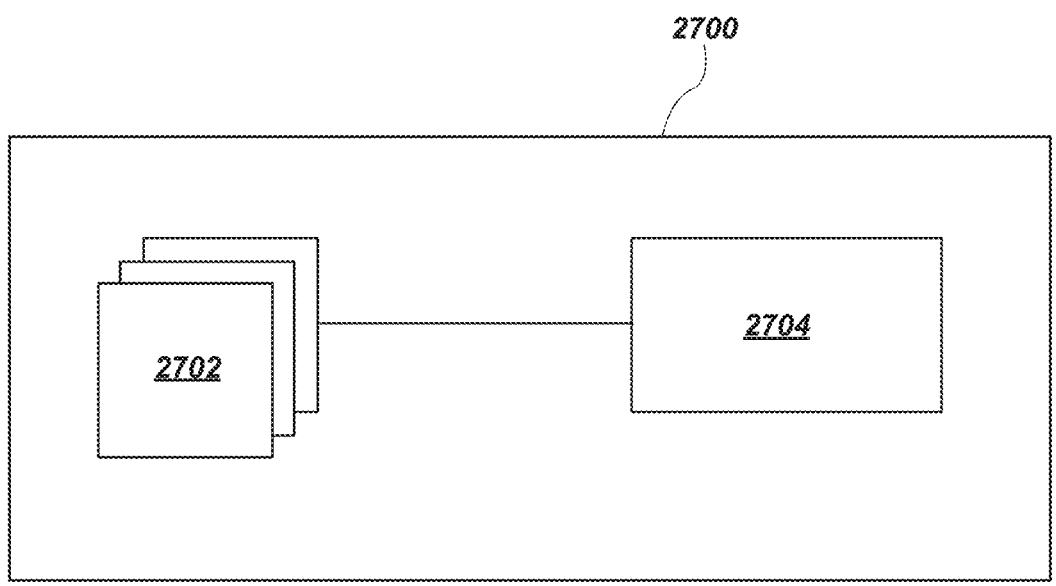
FIG. 27 is a functional block diagram of an electronic device including the electronic structures according to embodiments of the disclosure.

One or more of the electronic structures 100, 100', 100", 100'" according to embodiments of the disclosure may be present in an electronic device, which may include, but is not limited to, a 3D NAND Flash memory device. The electronic device may be present in a memory array 2700, as shown schematically in FIG. 27. The memory array 2700 includes a memory array of memory cells 2702 and a control logic component 2704. The electronic structures 100, 100', 100", 100'" according to embodiments of the disclosure include multiple memory cells. The control logic component 2704 may be configured to operatively interact with the memory array of memory cells 2702 so as to read, write, or re-fresh any or all memory cells within the memory array of memory cells 2702. The memory cells of the memory array 2700 are coupled to access lines (e.g., the conductive materials 115), and the access lines are coupled to control gates of the memory cells. A string of memory cells of the memory array 2700 is coupled in series between a source line and a data line (e.g., a bit line). The memory cells are positioned between the access lines and the data lines. The access lines may be in electrical contact with, for example, the conductive materials 115 of the stacks 105, and the data lines may be in electrical contact with an electrode (e.g., a top electrode) of the stacks 105. The data lines may directly overlie a row or column of the memory cells and contact the top electrode thereof. Each of the access lines may extend in a first direction and may connect a row of the memory cells. Each of the data lines may extend in a second direction that is at least substantially perpendicular to the first direction and may connect a column of the memory cells. A voltage applied to the access lines and the data lines may be controlled such that an electric field may be selectively applied at an intersection of at least one access line and at least one bit line, enabling the memory cells to be selectively operated. Additional process acts to form the memory array 2700 including the electronic structures 100, 100', 100", 100'" are conducted by conventional techniques.

Accordingly, another electronic device is disclosed and comprises an array of memory cells and access lines and bit lines electrically coupled to the memory cells. The memory cells comprise stacks of alternating dielectric materials and conductive materials in a cell region of an electronic device. Storage node segments are adjacent to adjoining oxide materials in a pillar region of the electronic device. The storage node segments are separated from one another by the dielectric materials of the stacks and the adjoining oxide materials, which comprise a first oxide material and a second oxide material.

Accordingly, a method of forming an electronic device is disclosed. The method comprises forming pillar openings in stacks of alternating dielectric materials and nitride materials. Recesses are formed in the dielectric materials of the stacks and a first high-k dielectric material is formed in the recesses and adjacent to the dielectric materials and the nitride materials. Portions of the first high-k dielectric material adjacent to the nitride materials are removed. A first oxide material is selectively formed adjacent to the nitride materials and a second oxide material is formed adjacent to the first oxide material. A storage node is formed in the recesses and adjacent to the second oxide material and a tunnel region and a channel are formed adjacent to the storage node. The nitride materials of the stacks are removed to form cell openings between the dielectric materials of the stacks. A portion of the first high-k dielectric material is removed to expose the second oxide material and a portion of the second oxide material is removed to expose the storage node. A portion of the storage node is removed to extend the openings and to form storage node segments.

Figure 28:
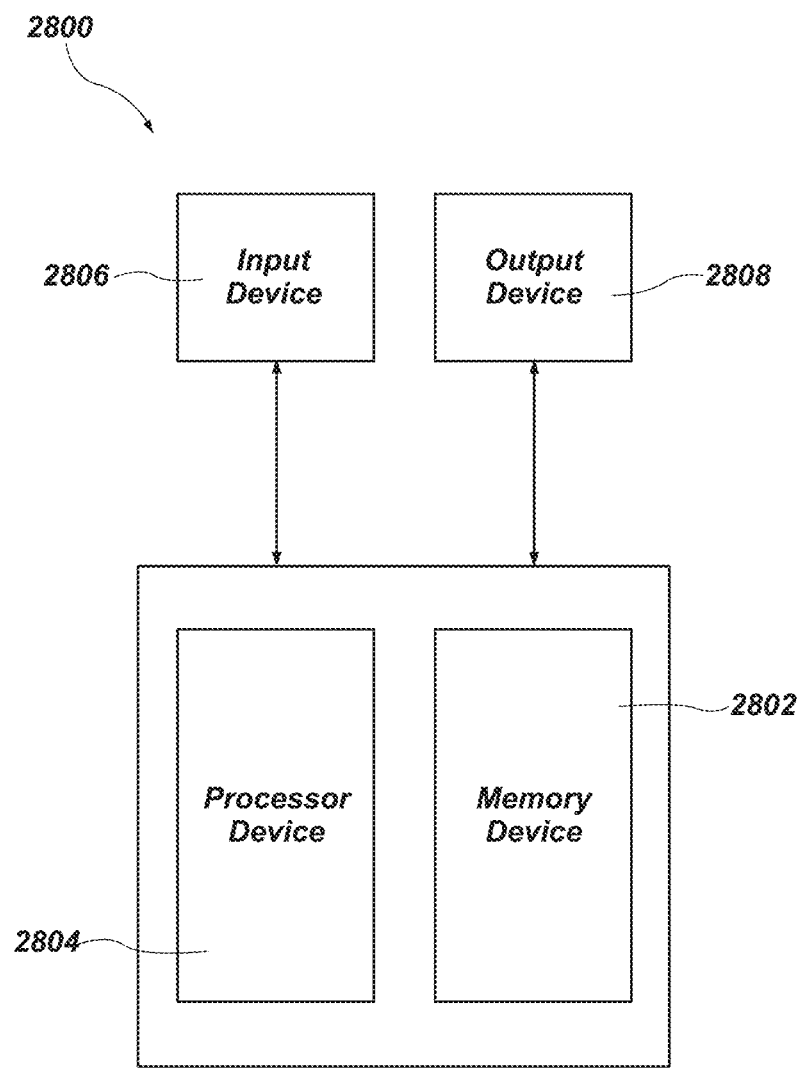
FIG. 28 is a simplified block diagram of a system including the electronic structures according to embodiments of the disclosure.

A system 2800 is also disclosed, as shown in FIG. 28, and includes the one or more electronic structures 100, 100', 100", 100'" according to embodiments of the disclosure. FIG. 28 is a simplified block diagram of the system 2800 implemented according to one or more embodiments described herein. The system 2800 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, a navigation device, etc. The system 2800 includes at least one memory device 2802, which includes the electronic structures 100, 100', 100'', 100''' as previously described. The system 2800 may further include at least one processor device 2804, such as a microprocessor, to control the processing of system functions and requests in the system 2800. The processor device 2804 and other subcomponents of the system 2800 may include the memory cells. The processor device 2804 may, optionally, include one or more memory arrays 2700 as previously described.

Various other devices may be coupled to the processor device 2804 depending on the functions that the system 2800 performs. For example, an input device 2806 may be coupled to the processor device 2804 for inputting information into the electronic system 2800 by a user, such as, for example, a mouse or other pointing device, a button, a switch, a keyboard, a touchpad, a light pen, a digitizer and stylus, a touch screen, a voice recognition system, a microphone, a control panel, or a combination thereof. An output device 2808 for outputting information (e.g., visual or audio output) to a user may also be coupled to the processor device 2804. The output device 2808 may include an LCD display, an SED display, a CRT display, a DLP display, a plasma display, an OLED display, an LED display, a three-dimensional projection, an audio display, or a combination thereof. The output device 2808 may also include a printer, an audio output jack, a speaker, etc. In some embodiments, the input device 2806 and the output device 2808 may comprise a single touchscreen device that can be used both to input information to the electronic system 2800 and to output visual information to a user. The one or more input devices 2806 and output devices 2808 may communicate electrically with at least one of the memory device 2802 and the processor device 2804. The at least one memory device 2802 and processor device 2804 may also be used in a system on chip (SoC).

Accordingly, a system is disclosed. The system comprises a processor operably coupled to an input device and an output device, and an electronic device operably coupled to the processor. The electronic device comprises memory cells and one or more of the memory cells comprises stacks of alternating dielectric materials and conductive materials in a cell region of the electronic device. Adjoining oxide materials are between the conductive materials in the cell region and storage node segments in a pillar region of the electronic device. The storage node segments are vertically adjacent to one another.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A method of forming an electronic device, comprising:
    forming pillar openings in stacks of alternating dielectric materials and nitride materials;
    forming recesses in the dielectric materials of the stacks;
    forming a first high-k dielectric material in the recesses and adjacent to the dielectric materials and the nitride materials;
    removing portions of the first high-k dielectric material adjacent to the nitride materials;
    selectively forming a first oxide material adjacent to the nitride materials;
    forming a second oxide material adjacent to the first oxide material;
    forming a storage node in the recesses and adjacent to the second oxide material;
    forming a tunnel region and a channel adjacent to the storage node;
    removing the nitride materials of the stacks to form cell openings between the dielectric materials of the stacks;
    forming a second high-k dielectric material in the cell openings;
    forming conductive materials in the cell openings;
    removing the dielectric materials of the stacks to form openings between the conductive materials of the stacks;
    removing a portion of the first high-k dielectric material to expose the second oxide material;
    removing a portion of the second oxide material to expose the storage node; and
    removing a portion of the storage node to extend the openings and to form storage node segments.

2. The method of claim 1, wherein removing portions of the first high-k dielectric material adjacent to the nitride materials comprises removing the first high-k dielectric material from sidewalls of the nitride materials.

3. The method of claim 1, wherein selectively forming a first oxide material adjacent to the nitride materials comprises selectively growing the first oxide material on the nitride materials of the stacks.

4. The method of claim 1, wherein selectively forming a first oxide material adjacent to the nitride materials comprises forming a nitride material on the nitride materials of the stacks and converting the nitride material to the first oxide material.

5. The method of claim 1, wherein forming a second oxide material adjacent to the first oxide material comprises conformally forming the second oxide material in the recesses and adjoining the first oxide material.

6. The method of claim 1, wherein removing a portion of the second oxide material to expose the storage node comprises forming recessed openings between the storage node and the first high-k dielectric material.

7. The method of claim 1, wherein forming a storage node in the recesses and adjacent to the second oxide material comprises partially filling the recesses with the storage node, the storage node comprising vertical openings therein.

8. The method of claim 7, further comprising forming a portion of the tunnel region in the vertical openings to form vertical portions of the tunnel region.

9. The method of claim 8, wherein removing a portion of the storage node to form storage node segments comprises removing the portion of the storage node to expose the vertical portions of the tunnel region, the vertical portions of the tunnel region separating the storage node into the storage node segments.

10. The method of claim 1, wherein forming a storage node in the recesses and adjacent to the second oxide material comprises substantially completely filling the recesses with the storage node.

11. The method of claim 10, wherein removing a portion of the storage node to extend the openings comprises removing an exposed portion of the storage node and exposing the tunnel region.

12. The method of claim 1, further comprising forming the dielectric materials in the extended openings between the conductive materials of the stacks.

13. The method of claim 1, further comprising forming air gaps in the extended openings between the conductive materials of the stacks.

14. A method of forming an electronic device, comprising:
    forming pillar openings in stacks of alternating dielectric materials and nitride materials;
    forming recesses in the dielectric materials of the stacks;
    forming a first high-k dielectric material in the recesses and adjacent to the dielectric materials and the nitride materials;
    removing the first high-k dielectric material adjacent to the nitride materials;
    selectively forming a first oxide material adjacent to the nitride materials;
    forming a second oxide material adjacent to the first oxide material;
    forming a storage node in the recesses and adjacent to the second oxide material, the storage node substantially completely filling the recesses;
    forming a tunnel region and a channel adjacent to the storage node;
    removing the nitride materials of the stacks to form cell openings between the dielectric materials of the stacks;
    forming a second high-k dielectric material on sidewalls of the dielectric materials of the stack;
    forming conductive materials on the second high-k dielectric material;
    selectively removing the dielectric materials of the stacks and vertically-oriented portions of the first high-k dielectric material without substantially removing the second high-k dielectric material, horizontally-oriented portions of the first high-k dielectric material, and the conductive materials to form openings between the conductive materials of the stacks;
    removing a portion of the second oxide material to expose the storage node and to form recessed openings between the first high-k dielectric material and the storage node; and
    removing a portion of the storage node to extend the openings and to form storage node segments.

15. The method of claim 14, wherein selectively removing the dielectric materials of the stacks and vertically-oriented portions of the first high-k dielectric material comprises exposing sidewalls of the second oxide material and horizontally-oriented portions of the first high-k dielectric material.

16. The method of claim 14, wherein removing a portion of the second oxide material to expose the storage node and to form recessed openings comprises recessing the second oxide material between the first high-k dielectric material and the storage node.

17. The method of claim 14, wherein removing a portion of the storage node comprises removing exposed vertical portions and exposed horizontal portions of the storage node by an atomic layer epitaxy process.

18. The method of claim 17, wherein removing exposed vertical portions and exposed horizontal portions of the storage node by an atomic layer epitaxy process comprises separating the storage node segments from one another by the extended openings.

19. A method of forming an electronic device, comprising:
    forming pillar openings in stacks of alternating dielectric materials and nitride materials;
    forming recesses in the dielectric materials of the stacks;
    forming a first high-k dielectric material in the recesses and adjacent to the dielectric materials and the nitride materials;
    removing portions of the first high-k dielectric material to expose the nitride materials;
    selectively forming a first oxide material on sidewalls of the nitride materials;
    forming a second oxide material adjacent to the first oxide material, a relative thickness of the second oxide material differing from a relative thickness of the first oxide material;
    forming a storage node adjacent to the second oxide material, the storage node substantially completely filling the recesses;
    forming a tunnel region and a channel adjacent to the storage node;
    removing the nitride materials of the stacks to form cell openings between the dielectric materials of the stacks;
    forming a second high-k dielectric material on exposed surfaces of the dielectric materials of the stack;
    forming conductive materials in the cell openings;
    selectively removing the dielectric materials of the stacks and vertically-oriented portions of the first high-k dielectric material without substantially removing the second high-k dielectric material, horizontally-oriented portions of the first high-k dielectric material, and the conductive materials to form openings between the conductive materials of the stacks;
    removing a portion of the second oxide material to expose the storage node; and
    removing a portion of the exposed storage node to form storage node segments, the storage node segments vertically adjacent to one another and positioned between the second oxide material and the tunnel region.

20. The method of claim 19, wherein removing a portion of the exposed storage node to form storage node segments comprises forming the storage node segments exhibiting a relatively shorter length than a length of the first oxide material.

* * * * *